United States Patent [19]

Leonard

[11] Patent Number: 4,691,101
[45] Date of Patent: Sep. 1, 1987

[54] OPTICAL POSITIONAL ENCODER COMPRISING IMMEDIATELY ADJACENT DETECTORS

[75] Inventor: Mark G. Leonard, Los Altos, Calif.

[73] Assignee: Hewlett-Packard Company, Palo Alto, Calif.

[21] Appl. No.: 747,084

[22] Filed: Jun. 19, 1985

[51] Int. Cl.[4] ............................................. G01D 5/38
[52] U.S. Cl. ........................ 250/231 SE; 250/237 G; 340/347 P
[58] Field of Search ...................... 250/231 SE, 237 G; 340/347 P; 324/175; 356/395

[56] References Cited

U.S. PATENT DOCUMENTS

| | | | |
|---|---|---|---|
| 3,757,128 | 9/1973 | Vermuelen | 250/237 |
| 4,259,570 | 3/1981 | Leonard | 250/214 |
| 4,266,125 | 5/1981 | Epstein et al. | 250/237 |
| 4,271,364 | 6/1981 | Leonard | 307/355 |
| 4,451,731 | 5/1984 | Leonard | 250/237 |

OTHER PUBLICATIONS

"IC Reduces Price and Simplifies Assembly of Optical Encoder", *Electronic Products*, Jan. 2, 1987, Electronic Products' 11th Annual Product of the Year Awards.
Ohr, Stephan; "Optical Encoding Technique Keeps a Daisy Wheel Spinning"; *Electronic Design*, Jul. 11, 1985, p. 76.
Howard C. Epstein, *Optical and Mechanical Design Trade-Off In Incremental Encoders.*
Mark Leonard, *Push-Pull Optical Detector Integrated Circuit*, Dec. 1980.
Epstein et al., *An Incremental Optical Shaft Encoder Kit with Integrated Optoelectronics, pp. 10-15.*

Primary Examiner—Edward P. Westin
Assistant Examiner—Charles Wieland
Attorney, Agent, or Firm—Saundra S. Hand; Douglas A. Kundrat

[57] ABSTRACT

An optical shaft encoder has a light detector configuration that includes the function of a phase plate. The light detectors are one-half the width of a code wheel transmissive section and are arranged in groups of four so that each group corresponds to one pitch of the code wheel. The light detectors are interdigitated such that they are adjacent to one another and receive information from two channels. One light beam illuminates the four light detectors producing four electrical signals. The physical layout of the light detectors causes the output signals to be phase shifted 90° from each other. These signals are combined electronically in pairs forming quadrature push pull signals.

47 Claims, 18 Drawing Figures

OPTICAL POSITIONAL ENCODER COMPRISING IMMEDIATELY ADJACENT DETECTORS

BACKGROUND AND SUMMARY OF THE INVENTION

Optical encoders resolve the position and movement of a rotating shaft as described in U.S. Pat. Nos. 4,266,125 and 4,259,570, incorporated herein by reference. These prior-art optical encoders modulate a light beam with a code wheel that is mounted to the shaft and with a stationary phase plate. The modulated light beams are converted into electrical signals by light detectors. From these electrical signals, the speed and direction of the shaft rotation can be ascertained.

Prior-art optical encoders have numerous parts as shown in FIG. 1. These include light emitting diodes (LEDs), lenses for collimating the light beams, a code wheel mounted on the shaft for modulating the light beams, a phase plate for splitting the light beams and for introducing a phase difference of 90° between them, elaborate lenses, and light detectors for receiving the modulated light and converting it into electrical signals. Some of these parts are cumbersome to manufacture such as the bifurcated, truncated lenses for light detectors. The prior-art encoders have multiple sources of errors. The light beams emitted from the multiple LEDs may not be identical and the code wheel and the phase plate may not be aligned. Also, the distance between light detectors renders them sensitive to gradients in the light beams.

In accordance with the illustrated preferred embodiment of the present invention, an optical encoder has fewer parts, is therefore simpler and cheaper to manufacture, and has greater accuracy than prior-art encoders. The optical encoder has one light source producing one light beam, a simple lens for collimating the light beam, a code wheel for modulating the light beam, and light detectors for receiving the light beam and including the function of the phase plate. By reducing the number of parts and making them easier to fabricate, the manufacturing procedure is simpler and cheaper. Greater accuracy is achieved by using a single light source instead of multiple light sources. Also, the light detectors are placed immediately adjacent to one another, and each light detector receives information belonging to two channels. Furthermore, the light detector outputs are connected in a four-way push-pull configuration which cancels errors due to gradients in the light beam and misalignment of the code wheel.

DETAILED DESCRIPTION OF THE PREFERRED EMBODIMENT

Figure 1:
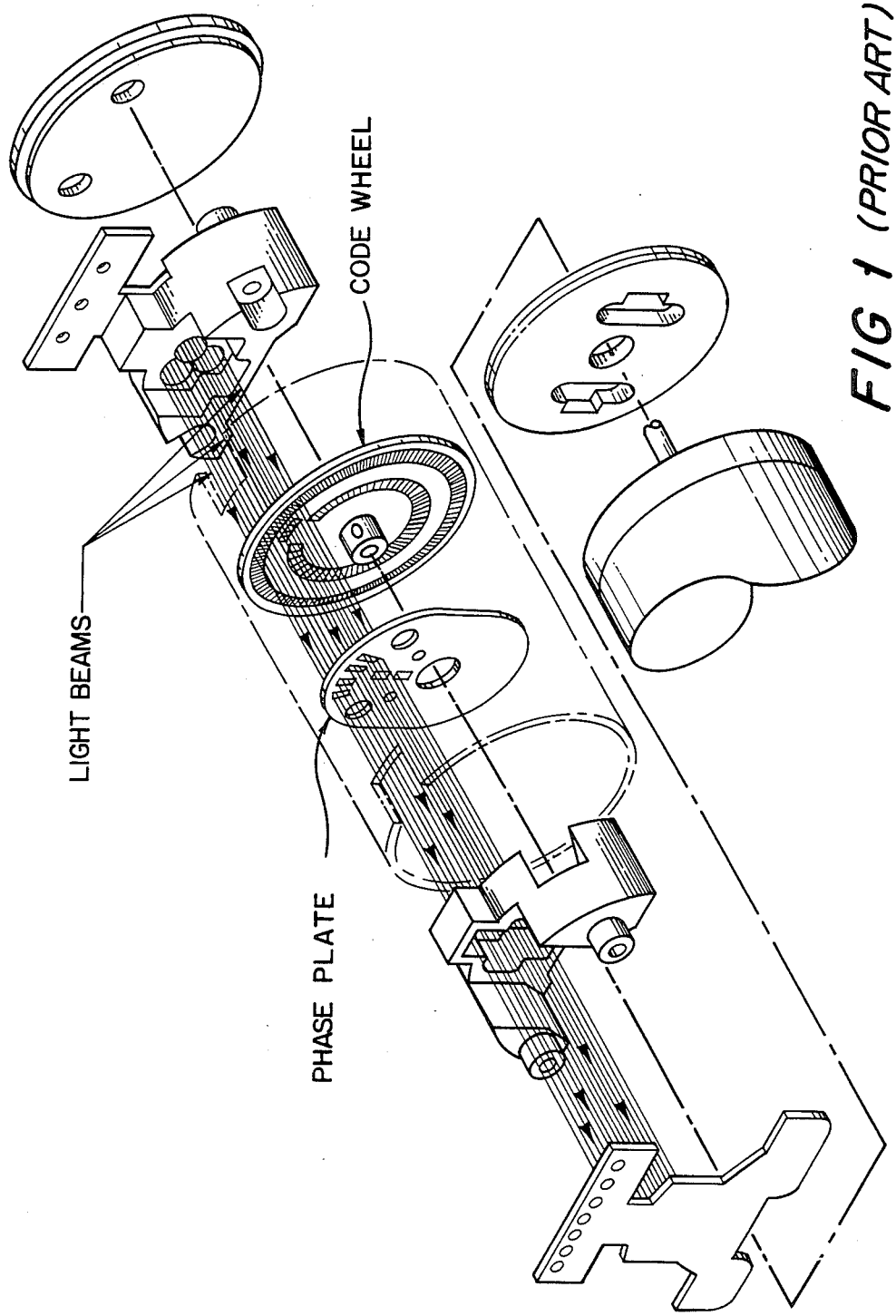
FIG. 1 shows a prior-art optical encoder.
Figure 2A:
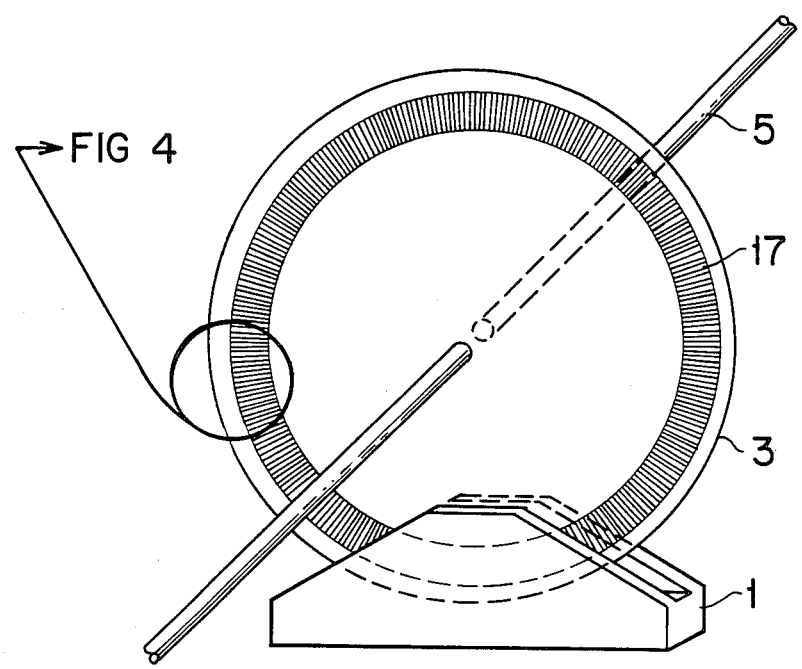
FIG. 2A shows an optical encoder constructed in accordance with the preferred embodiment of the invention.
Figure 2B:
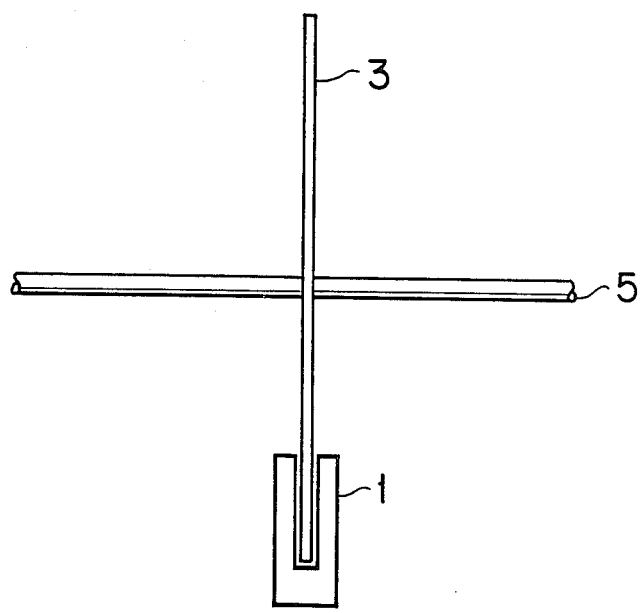
FIG. 2B shows a side view of the optical encoder shown in FIG. 2A.
Figure 3:
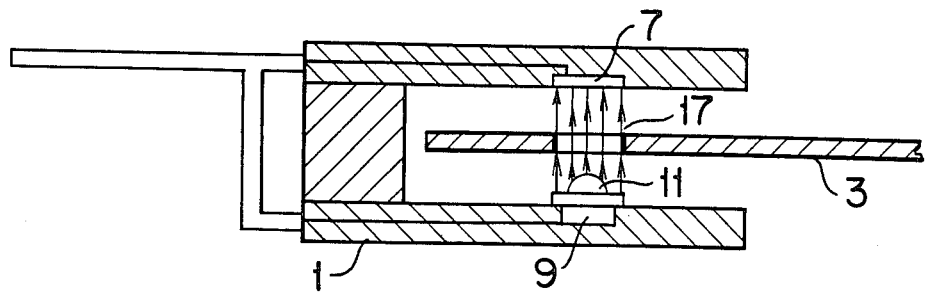
FIG. 3 is a cross-sectioned drawing of the optical encoder module shown in FIGS. 2A and 2B with a code wheel inserted therein.
Figure 7A:
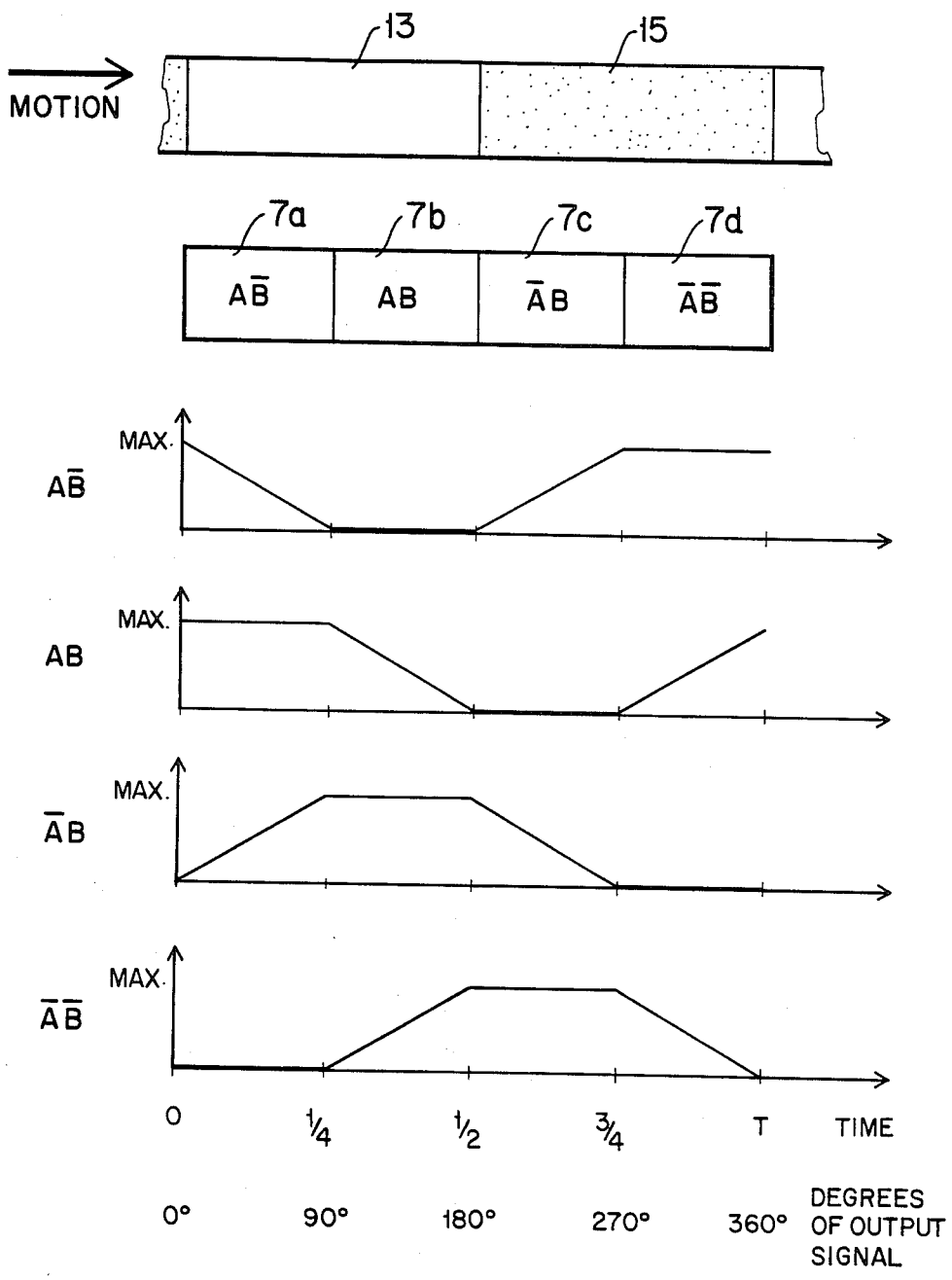
FIG. 7A shows the four output signals, shown in FIGS. 6A and 6B, in relation to the position of the transmissive and non-transmissive sections of the code wheel. T equals one cycle of the light detector output signals and the time required for one transmissive section to move across four light detectors.

The preferred embodiment of the invention is illustrated in FIGS. 2A–2B and 3. A module 1 provides a collimated light beam and has light detectors 7 to receive the light beam after it has been modulated by the code wheel 3. The function of the phase plate, found in prior-art optical encoders shown in FIG. 1, is included in the configuration of the light detectors 7. The light detector output signals $A\bar{B}$, $AB$, $\bar{A}B$, and $\overline{AB}$ shown in FIG. 7A, are in quadrature, that is they are identically shaped and are 90° out-of-phase with each other. Also, each signal contains information belonging to two channels. These output signals are processed by summing and comparator circuitry, shown in FIG. 8, to form two separate channels that are responsive to the rotation of the shaft 5.

Module

Module 1 produces one light beam. An LED 9, shown in FIG. 3, provides light having a wavelength of approximately 700 nanometers. However, any frequency of electromagnetic radiation having a wavelength substantially shorter than the relevant dimensions of the encoder could be utilized in the present invention if suitable lens materials, emitters and detectors are available. An emitter lens 11 is positioned to receive the light from the LED 9 and to provide one collimated beam of light.

Code Wheel

Figure 4:
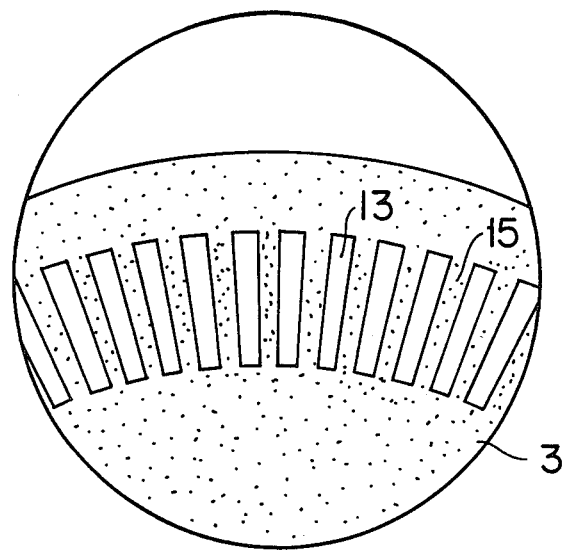
FIG. 4 is a detailed view of the code wheel shown in FIGS. 2A and 2B.

The code wheel 3 is concentrically mounted on the shaft 5, shown in FIGS. 2A-2B, to rotate with the shaft 5 and to modulate the light beam with its optical track 17. The optical track 17 has alternating transmissive sections 13 and non-transmissive sections 15 of equal width as shown in FIG. 4. One transmissive section 13 and one non-transmissive section 15 make up one pitch of the code wheel.

In the preferred embodiment, there are 500 transmissive sections 13 and an equal number of non-transmissive sections 15. The transmissive sections 13 and the non-transmissive sections 15 have a trapezoidal shape since they are located immediately adjacent to one another on a circular track. The maximum width of the transmissive sections is 114 microns, the minimum width is 104 microns, and the height is 1650 microns. The code wheel 3 is made of an optically opaque material, such as stainless steel, and has a diameter of approximately 37.338 mm. The transmissive sections can be formed in several different ways including a masking and etching process.

Light Detectors

Figure 5A:
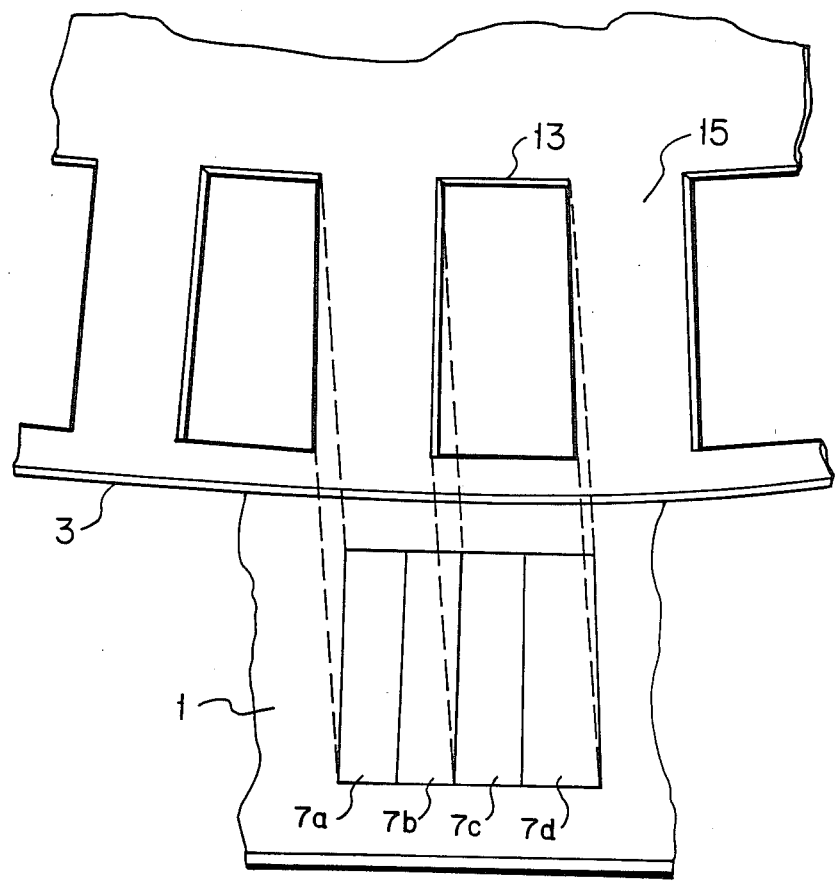
FIG. 5A shows the relative dimensions of the light detectors and code wheel transmissive sections shown in FIG. 4.
Figure 5B:
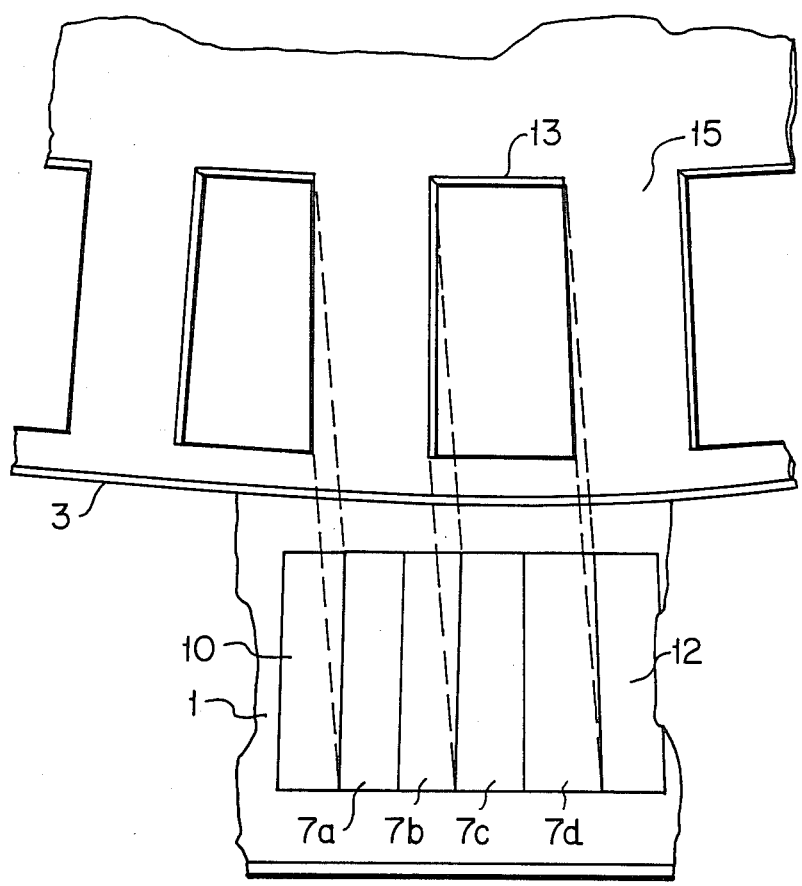
FIG. 5B shows the light detectors shown in FIG. 5A with dummy photodiodes attached to each end of the array.

In the preferred embodiment, there are 7 groups of the four light detectors 7a-d shown in FIG. 5. A group of four light detectors must have approximately the same size and shape as one transmissive section 13 and one non-transmissive section 15. Therefore, individual light detectors 7a-d have a trapezoidal shape with a maximum width of approximately 48 microns, a minimum width of approximately 45 microns, and a height of 785 microns. The width of two individual light detectors is slightly less than the width of one transmissive section because there is an 8 micron gap between the individual light detectors. The height of the transmissive sections 13 is greater than that of the light detectors 7 so that the transmissive sections 13 overlap the light detectors 7. With this overlap, the optical encoder can operate when the code wheel 3 is out of alignment. The light detectors 7 are photodiodes formed using standard bipolar semiconductor technology. However, the light detectors can be manufactured using other types of technology without departing from the scope of the invention. As illustrated in FIG. 5A, the groups of light detectors 7 are placed in a one dimensional array as close to one another as the bipolar semiconductor technology will allow. Dummy photodiodes 10 and 12, shown in FIG. 5B, are located on each end of the array to minimize the effect of stray light on the functioning light detectors 7a-d.

Figure 6A:
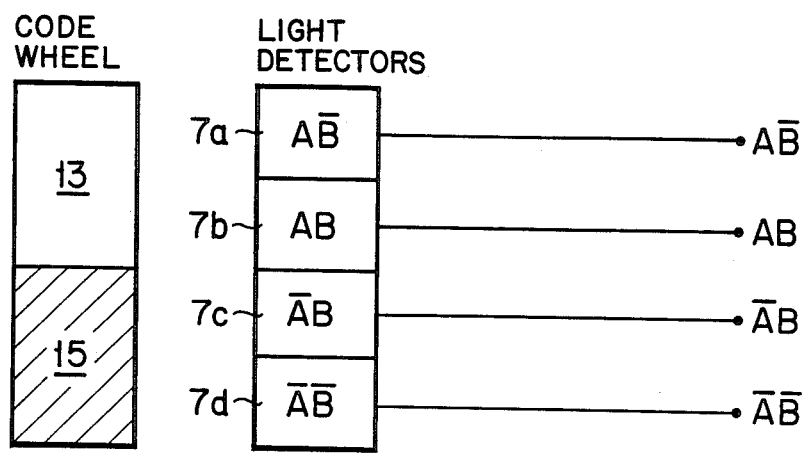
FIG. 6A shows four light detectors, shown in FIG. 5A, and their outputs.

The width of each individual light detector 7a-d is equal to half the width of one transmissive section 13 as shown in FIG. 5. The light detectors 7 are arranged in groups of four. Each group of four light detectors 7a-d has the same dimensions as one transmissive section 13 plus one non-transmissive section 15, and corresponds to one pitch of the code wheel 3. Furthermore, light detectors 7a-d are interdigitated, as shown in FIG. 5A, such that they are immediately adjacent to one another and receive information belonging to two channels. Each of the light detectors 7a-d produces one output signal as shown in FIG. 6A.

FIG. 7A shows one complete cycle of the output signals of the individual light detectors 7a-d. The output signal $\overline{AB}$ is produced by light detector 7a, output signal AB is produced by light detector 7b, output signal $\overline{A}B$ is produced by light detector 7c, and output signal $\overline{AB}$ is produced by light detector 7d. They have the same shape and period, but they are offset from one another by multiples of 90°. The period of an output signal equals the time required for one transmissive section 13 and one non-transmissive section 15 to move over that individual light detector. Each cycle of an output signal corresponds to one pitch of the code wheel.

The light beam from the LED 9 shines on the light detectors 7a-d through the transmissive sections 13 of the rotating code wheel 3. This results in columns of light, that have a cross-sectional area equal to the area of one transmissive section 13, moving across the light detectors 7a-d. The outputs of light detectors 7a-d vary in amplitude according to the amount of light incident upon them.

As the transmissive section 13, shown in FIG. 7A, of the code wheel 3 moves to the right and away from the light detector 7a, the A$\overline{B}$ output signal decreases in amplitude linearly for one-fourth cycle until that transmissive section 13 has separated from the light detector 7a. At this point, the A$\overline{B}$ output signal is zero for one-fourth cycle because the non-transmissive section 15 blocks all light from the light detector 7a. At the end of the second quarter cycle, another transmissive section 13 begins to pass over the light detector 7a and the amplitude of the A$\overline{B}$ output signal increases linearly in response to the increasing light intensity until the light detector 7a is completely covered by a transmissive section 13 at the completion of the third quarter cycle. During the fourth quarter cycle, the A$\overline{B}$ output signal remains at its peak amplitude as the transmissive section 13, having twice the width of one light detector, continues to transmit the light beam to the light detector 7a. After completion of the fourth quarter cycle, the sequence is repeated.

The formation of the AB output signal is identical to that of the A$\overline{B}$ output signal except that the light detector 7b is located differently relative to the code wheel 3. The light detector 7b is located one light detector to the right of the light detector 7a as shown in FIG. 7A. This layout of light detectors 7a-d results in the AB output signal having the same shape and period as the A$\overline{B}$ output signal but being delayed by one-fourth cycle or 90° from the A$\overline{B}$ output signal. Likewise, the light detector 7c is located two light detectors to the right of the light detector 7a, and produces the $\overline{A}B$ output signal which has the same shape and period as the A$\overline{B}$ output signal but is delayed by one half cycle or 180° from the A$\overline{B}$ output signal. The $\overline{AB}$ output signal from the light detector 7d is identical to the A$\overline{B}$ output signal except that it is delayed by three quarter cycles or 270° from the A$\overline{B}$ output signal because it is located three light detectors away. From this physical layout the four output signals A$\overline{B}$, AB, $\overline{A}B$, and $\overline{AB}$ are quadrature signals. That is, they have the same shape and period; but are delayed by multiples of 90° from each other.

Figure 6B:
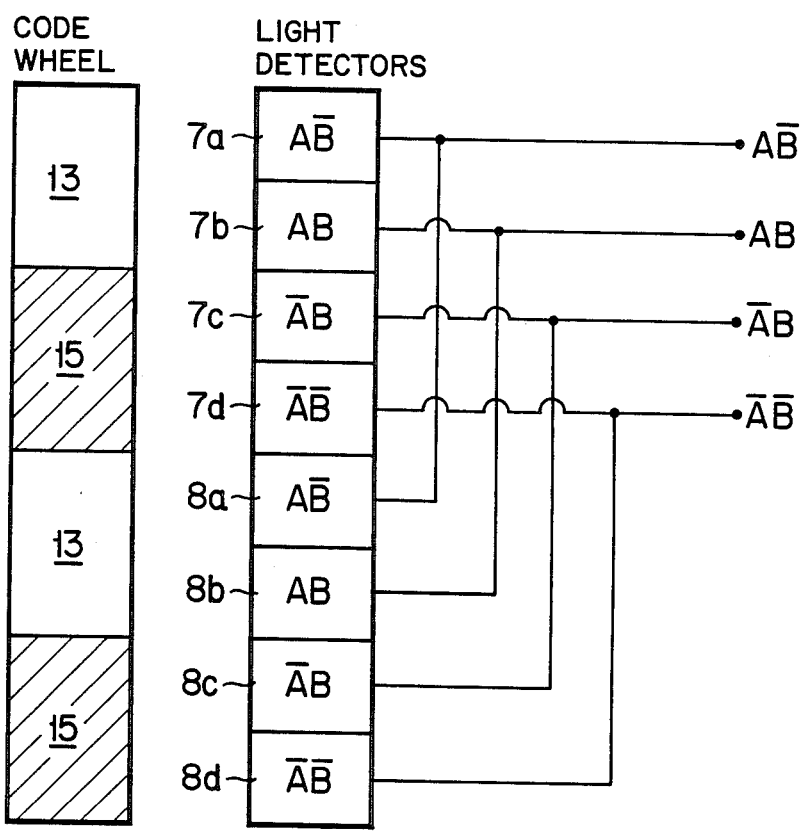
FIG. 6B shows eight light detectors, like those shown in FIG. 5A, connected together forming four light detector outputs.

When the output signals of two or more light detectors are identical, they can be connected together as shown in FIG. 6B. Output signals for light detectors 7a and 8a are identical because they are placed one pitch of the code wheel 3 apart. That is, the distance between 7a and 8a equals the width of one transmissive section 13 plus one non-transmissive section 15 as illustrated in FIG. 6B. Light detector sets 7b and 8b, 7c and 8c, and 7d and 8d are placed one pitch of the code wheel 3 apart and always have the same amount of light incident upon them. Therefore, their outputs will always be equal and they can be connected together to produce a higher power output signal for processing by the circuitry. FIG. 6B shows two groups of light detector 7a-d and 8a-d separated by one pitch of the code wheel 3 and having their outputs connected together.

The count of the optical encoder module 1 may be changed without departing from the scope of the invention. The count is the number of cycles the four output signals $A\bar{B}$, AB, $\bar{A}B$, and $\overline{AB}$ go through in one revolution of the shaft 5. Higher counts permit finer control of the shaft 5 rotation. In some embodiments such as a daisy wheel printer, a particular count is required. The count is changed by increasing or decreasing the number of transmissive sections 13 on the code wheel 3. This causes the dimensions of the transmissive sections 13 and light detectors 7 to change accordingly. When the width of the transmissive sections 13 and the individual light detectors 7a-d are reduced, the amplitude of the output signals $A\bar{B}$, AB, $\bar{A}B$, and $\overline{AB}$ are decreased and they may be too small for processing by the circuitry. By increasing the number of light detectors 7 groups and coupling their outputs together, higher power output signals $A\bar{B}$, AB, $\bar{A}B$, and $\overline{AB}$ will be formed. Likewise, if the size of the light detectors 7a-d and the transmissive sections 13 are increased, it may be possible to reduce the number of light detectors. All of this can be done without departing from the scope of the invention.

The Processing Circuitry

Figure 7B:
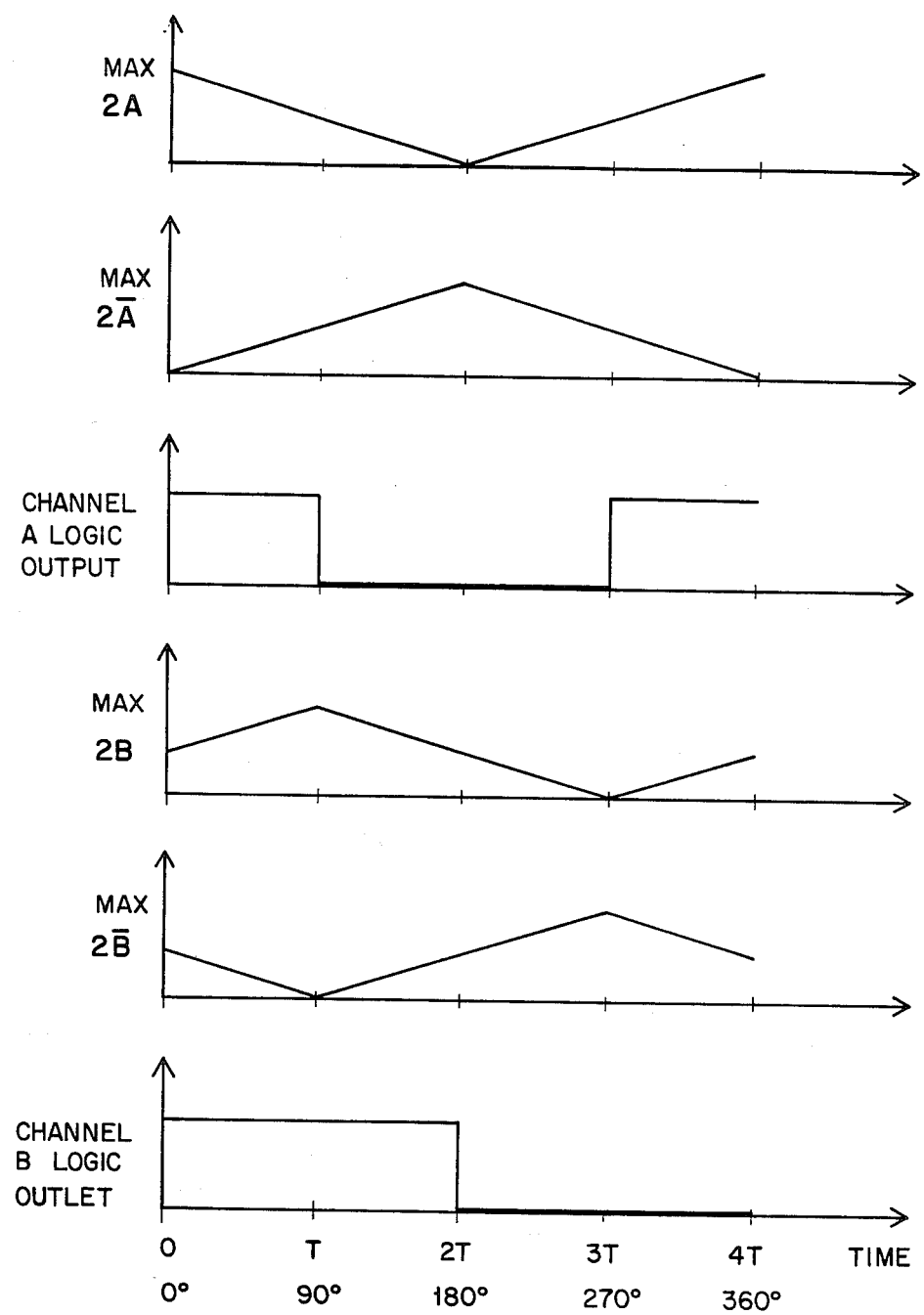
FIG. 7B shows the outputs of the summers and comparators, shown in FIG. 8, in relation to the four output signals shown in FIG. 7A.
Figure 8:
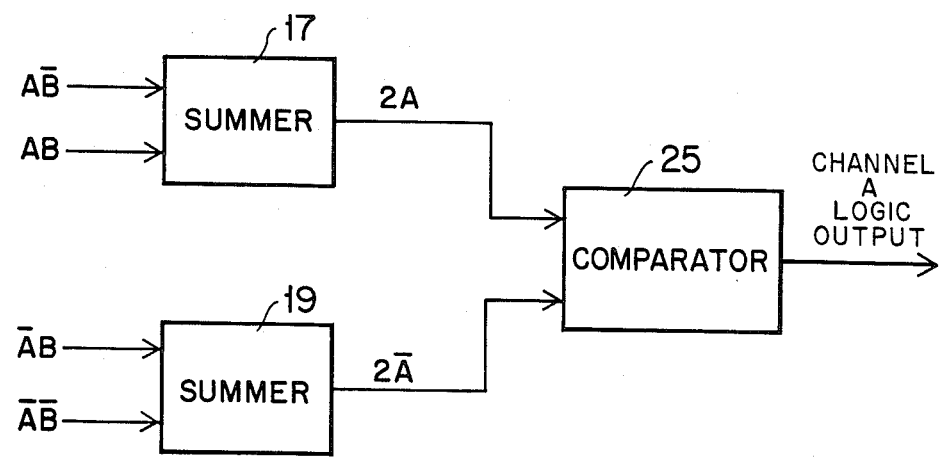
FIG. 8 shows how the four light detector output signals in FIG. 7A, are processed into various waveforms.
Figure 8:
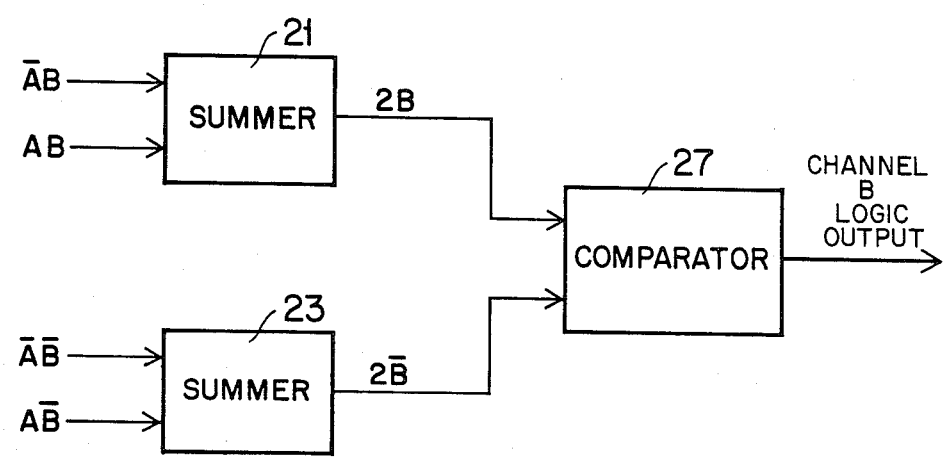

The optical encoder module 1 has a two channel output. The speed of the shaft 5 rotation can be determined from one channel, but two channels are needed to determine the direction of the shaft 5 rotation. Each light detector output $A\bar{B}$, AB, $\bar{A}B$ and $\overline{AB}$ contains information belonging to these two channels. FIG. 8 shows how these signals are separated into two channels. Light detector outputs $A\bar{B}$ and AB are added by summer 17 to produce signal 2A which is shown in FIG. 7B. Summer 19 adds $\bar{A}B$ and $\overline{AB}$ to produce $\overline{2A}$ also shown in FIG. 7B. Summer output signals 2A and $\overline{2A}$ are compared by a comparator 25 to produce the Channel A Logic Output shown in FIG. 7B. Likewise, another summer 21 adds $\bar{A}B$ and AB to produce 2B shown in FIG. 7B. Another summer 23 adds $\bar{A}B$ and $A\bar{B}$ to produce $\overline{2B}$ shown in FIG. 7B. A comparator 27 shown in FIG. 8 compares the summer outputs 2B and $\overline{2B}$ to produce Channel B Logic Output signal shown in FIG. 7B. This circuitry is described and claimed in U.S. Pat. Nos. 4,271,364 and 4,259,570 which are incorporated herein by reference. There are many different ways to process the summer output signals 2A, $\overline{2A}$, 2B, and $\overline{2B}$ without departing from the scope of the invention. For example, an alternate embodiment of the invention produces analog output signals for channels A and B that indicates the position of the code wheel 3. The circuitry for producing this alternate embodiment is described in U.S. Pat. No. 4,259,570.

Figure 9:
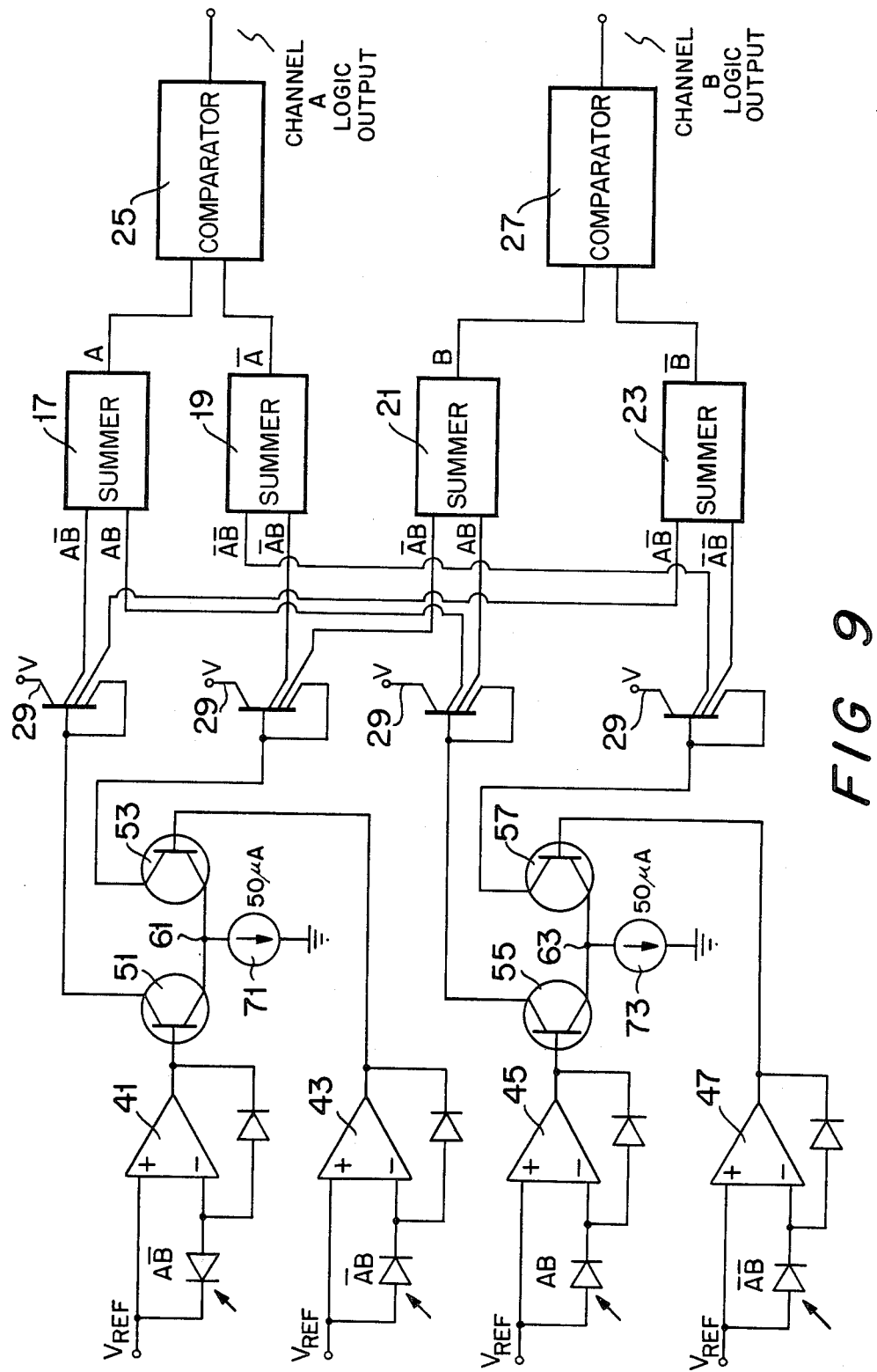
FIG. 9 shows the circuitry that prepares the light detector output signals, shown in FIG. 7A, for the summers and comparators shown in FIG. 8.

FIG. 9 shows the circuitry used to prepare the light detector outputs $A\bar{B}$, $\bar{A}B$, AB, and $\overline{AB}$ for the summers 17, 19, 21, and 23. In the preferred embodiment, each light detector 7a-d is connected between a reference voltage and a preamp input. The preamps 41, 43, 45, 47 perform a logarithm operation on the light detector output signals to produce the preamp outputs. These preamp output signals are connected to the bases of transistors 51, 53, 55, 57 that comprise two differential amplifiers. One differential amplifier 61 amplifies preamp output signals $A\bar{B}$ and $\bar{A}B$ exponentially. The differential amplifier 61 output signals have the same current ratio as light detector output signals $A\bar{B}$ and $\bar{A}B$, but their sums must equal the output of the current source 71. Likewise, a second differential amplifier 63 amplifies preamp output signals AB and $\overline{AB}$ exponentially. These signals have the same current ratio as light detector output signals AB and $\overline{AB}$, but their sums must equal the output of current source 73.

The current mirrors 29 in FIG. 9, replicate these current signals to provide inputs for the summers 17, 19, 21, and 23.

Alternate Embodiments

Figure 10:
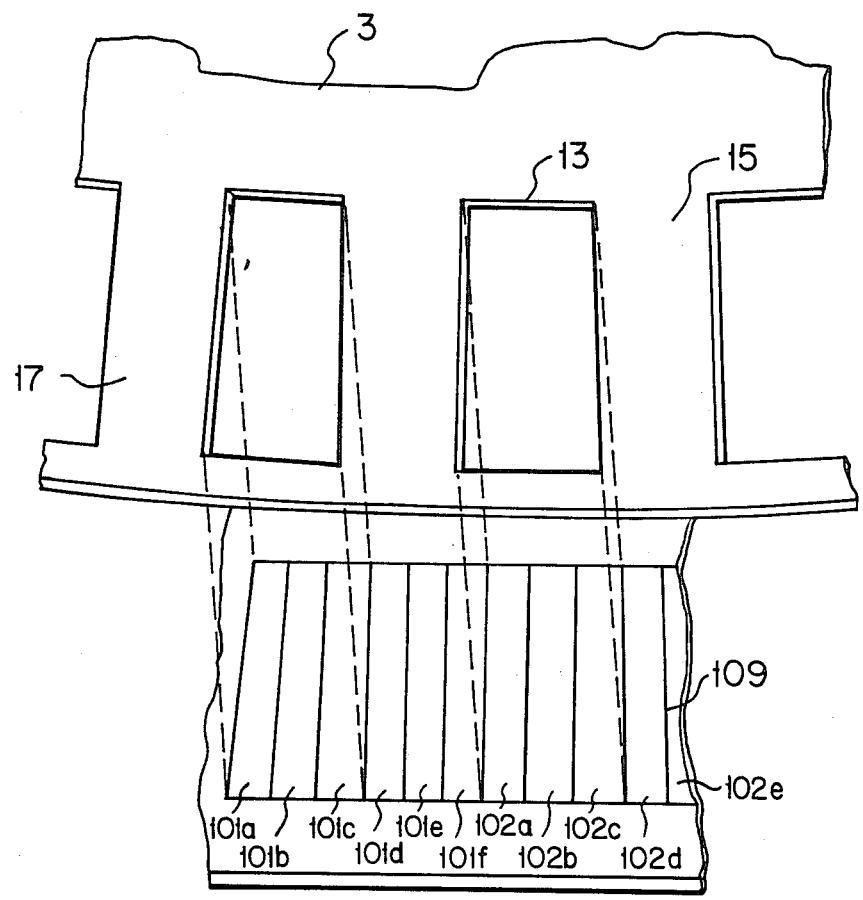
FIG. 10 shows an alternate embodiment of the optical encoder, shown in FIGS. 2A–2B, having groups of six light detectors instead of four.

The preferred embodiment arranges light detectors 7a-d and 8a-d in groups of four that produce output signals that are delayed from each other by multiples of 90°. However, alternate embodiments may arrange light detectors in groups of 6, 8, or some other number and produce output signals that are delayed from each other by multiples of 60°, 45°, or 360° divided by the number of light detectors in one group. FIG. 10 shows an alternate embodiment where light detectors 101a-f are arranged in groups of six.

Figure 11A:
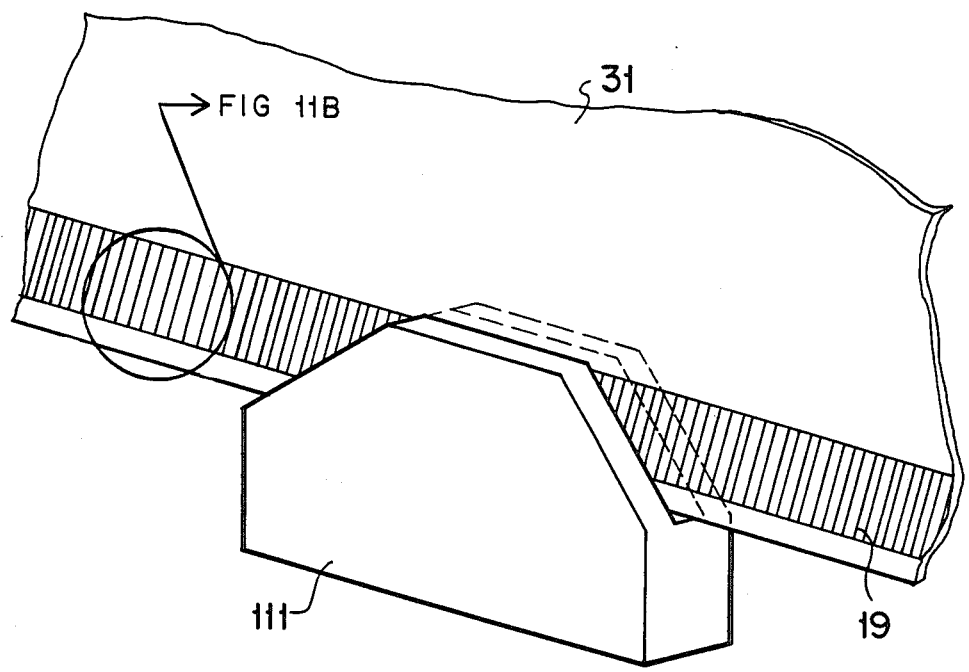
FIG. 11A shows an alternate embodiment of the encoder shown in FIGS. 2A–2B where a code strip is used to determine position along a line.
Figure 11B:
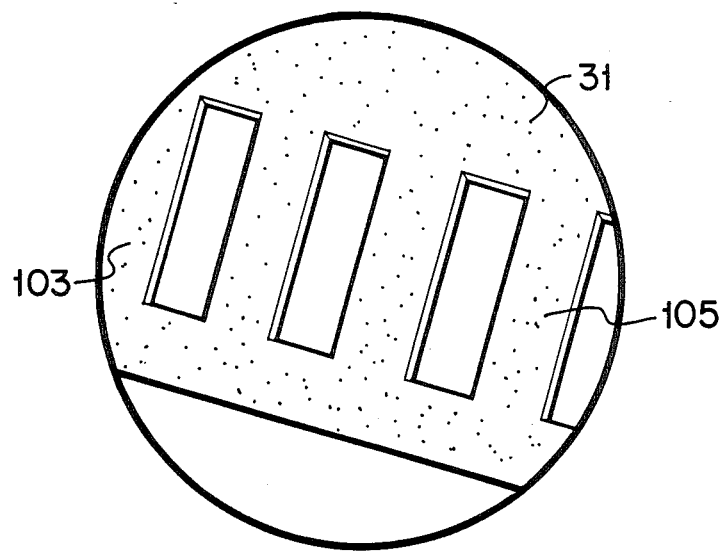
FIG. 11B shows a detailed view of the code strip shown in FIG. 11A.

Another alternative embodiment of the invention uses a code strip 31, as shown in FIG. 11A, instead of a code wheel 3 for tracking movement and position along a route. The code strip 31 has transmissive sections 103 and non-transmissive sections 105 identical to those on code wheel 3 except that they have a rectangular shape instead of a trapezoidal shape. Module 111 is identical to module 1 except that the light detectors are rectangular instead of trapezoidal. The number and size of transmissive sections 103 on the code strip 31 can be changed as discussed above without departing from the scope of the invention. The optical encoder resolution is determined by the number of transmissive sections 103 per unit length.

Figure 12A:
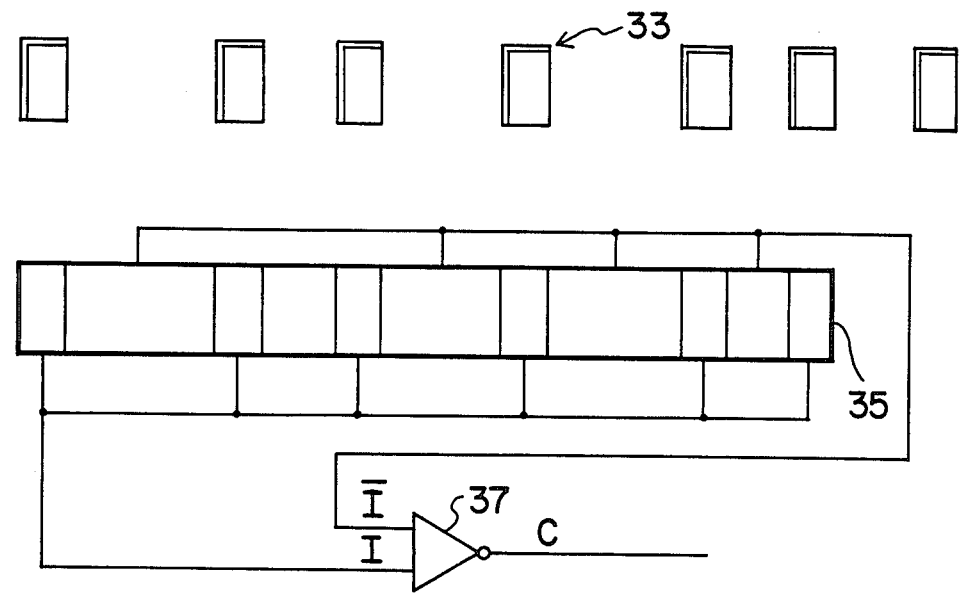
FIG. 12A shows an alternate embodiment of the code wheel optical track and light detector configuration for producing an index pulse.
Figure 12B:
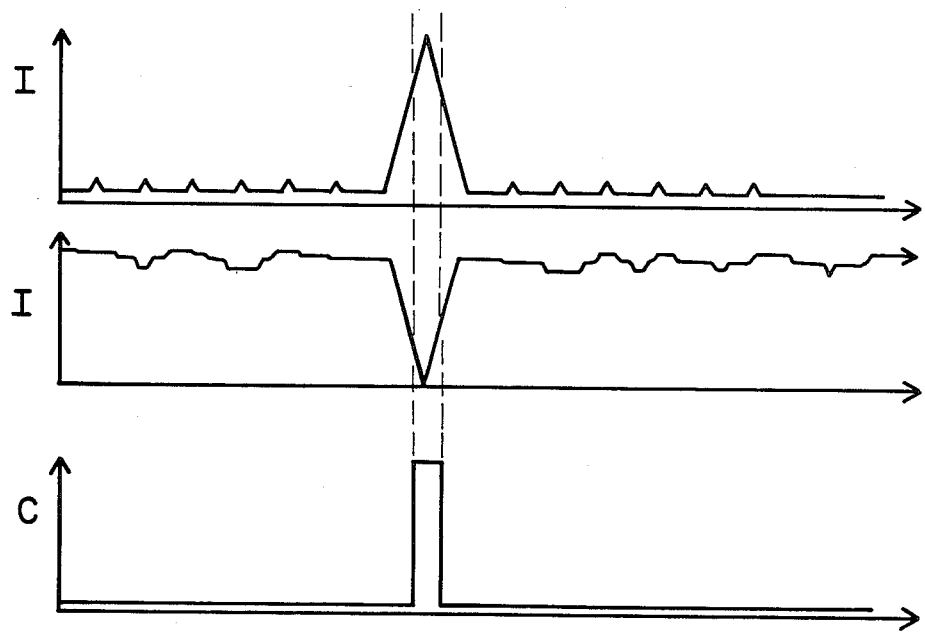
FIG. 12B shows the output signals of the light detectors shown in FIG. 12A and the index pulse formed from them.

In other alternate embodiments, it may be desirable to produce an index pulse to signify the completion of a shaft 5 revolution or some fraction of a shaft 5 revolution. In this case, another LED and emitter lens (not shown) producing a another beam of light may be utilized for providing index pulses. This light beam will be modulated by a another track 33 on the code wheel, as shown in FIG. 12A, and will be detected by interdigitated light detectors 35, shown in FIG. 12A. These interdigitated light detectors 35 include the function of the phase plate used in prior-art optical encoders and produce push-pull output signals. The outputs of alternate light detectors will be connected together to form two separate light detector output signals I and $\bar{I}$ shown in FIG. 12B which obtain their extreme amplitude at the same time. The number of times this extreme amplitude is reached during one revolution of the shaft is equal to the number of index pulses per revolution of the shaft. I and $\bar{I}$ are compared by the comparator 37 shown in FIG. 12A to produce an index pulse, as shown in FIG. 12B, when both output signals reach their extreme amplitudes. To obtain a sharp index pulse, the transmissive sections 13 of the index pulse optical track 33 are unevenly spaced as described in U.S. Pat. No. 4,451,731 which is incorporated herein by reference. Also, transmissive sections are located throughout the entire length of the optical track to maintain $\bar{I}$'s amplitude as also described in U.S. Pat. No. 4,451,731.

The embodiment of the invention using a code strip instead of a code wheel may also have index pulses to signify when an object has traversed some fraction of the route or has reached either end of the route.

I claim:

1. An optical encoder for indicating the rotational movement of a shaft, comprising:
   an emitter means for emitting a light beam along a light path;
   a light modulation means concentrically attached to the shaft and placed in the light path for modulating the light beam in response to the rotation of the shaft; and
   a detector means, positioned in the light path, for detecting said modulated light beam with individual light detectors located immediately adjacent to one another and for generating more than one output signal in response to the rotation of the shaft wherein the output signals have substantially the same shape and are delayed from each other by approximately integer multiples of 360° divided by the number of signals.

2. An optical encoder as in claim 1 further comprising at least one output channel formed from a plurality of the output signals.

3. An optical encoder as in claim 2 wherein the light modulation means comprises an optical track positioned to cross the light path, the optical track having alternating transmissive and non-transmissive sections operative for modulating the light beam in response to the rotating shaft.

4. An optical encoder as in claim 3 wherein the individual light detectors are arranged into groups.

5. An optical encoder as in claim 4 wherein each group of light detectors has substantially the same dimensions as one transmissive section plus one non-transmissive section.

6. An optical encoder as in claim 5 wherein the individual light detectors each have substantially the same shape and size.

7. An optical encoder as in claim 6 wherein each of the transmissive sections have substantially the same shape and size.

8. An optical encoder as in claim 7 wherein individual light detectors located a distance of one transmissive section plus one non-transmissive section apart have their outputs signals connected together forming coupled outputs.

9. An optical encoder as in claim 8 further comprising an electrical means for converting the coupled outputs into n/2 output channels where n equals the number of light detectors in one group.

10. An optical encoder as in claim 9 wherein each group of light detectors consists of four individual light detectors.

11. An optical encoder as in claim 10 wherein the outputs of the individual light detectors have substantially identical shapes and are delayed from each other by approximately integer multiples of 90°.

12. An optical encoder as in claim 11 wherein the emitter means comprises an LED and a collimating lens.

13. An optical encoder as in claim 12 wherein:
   the individual light detectors are located in an array having two ends; and
   a dummy light detector is located at each end of the array.

14. An optical encoder as in claim 13 wherein the light detectors are photodiodes.

15. An optical encoder as in claim 14 wherein each of the light detectors have a trapezodial shape.

16. An optical encoder as in claim 1 further comprising:
   a second track on the light modulation means with transmissive and non-transmissive sections aligned to modulate a light beam; and
   a second detector means, positioned in the light path for receiving the light beam modulated by the second track, and for generating index signals that reach their extreme amplitude at least once during each revolution of the shaft.

17. An optical encoder as in claim 16 wherein:
   the second detector means comprises individual light detectors located immediately adjacent to one another wherein the individual light detectors have outputs; and
   the outputs of alternate light detectors are connected together thereby forming two output index signals.

18. An optical encoder as in claim 17 wherein the size and shape of the light detectors and transmissive sections are operative for the two output signals reaching their extreme amplitude at least once during each revolution of the shaft.

19. An optical encoder as in claim 18 further comprising an electical means coupled to the output index signals for producing an index pulse in response to the extreme amplitudes of the output index signals.

20. An optical encoder for indicating the rotational movement of a shaft, comprising:
   an emitter means for emitting a light beam along a light path;
   a light modulation means concentrically attached to the shaft and placed in the light path for modulating the light beam in response to the rotation of the shaft; and
   a detector means, positioned in the light path, for receiving the modulated light beam with individual light detectors located immediately adjacent to one another and for generating index signals that reach their extreme amplitude at least once during each revolution of the shaft.

21. An optical encoder as in claim 20 wherein:
   the outputs of alternate light detectors are connected together thereby forming two output index signals.

22. An optical encoder as in claim 21 wherein the light modulation means comprises an optical track positioned to cross the light path, the optical track having alternating transmissive and non-transmissive sections operative for modulating the light beam in response to the rotating shaft.

23. An optical encoder as in claim 22 wherein the size and shape of the light detectors and transmissive sections are operative for the two output signals reaching their extreme amplitude at least once during each revolution of the shaft.

24. An optical encoder as in claim 23 further comprising an electrical means coupled to the output index signals for producing an index pulse in response to the extreme amplitudes of the output index signals.

25. An optical encoder for indicating an object's movement along a route, comprising:
   an emitter means for emitting a light beam along a light path;
   a light modulation means located next to the emitter means and in the light path for modulating the light beam in response to the object's movement along the route; and a detector means, positioned in the light path, for receiving the modulated light beam with individual light detectors located immediately adjacent to one another and for generating more than one signal in response to the object's movement along the route wherein the signals have substantially the same shape and are delayed from each other by approximately integer multiples of 360° divided by the number of signals.

26. An optical encoder as in claim 25 further comprising at least one output channel formed from a plurality of the output signals.

27. An optical encoder as in claim 26 wherein the light modulation means comprises an optical track positioned on the light modulation means to cross the light path, the optical track having alternating transmissive and non-transmissive sections and being operative for modulating the light beam in response to movement along a route.

28. An optical encoder as in claim 27 wherein the individual light detectors are arranged into groups.

29. An optical encoder as in claim 28 wherein each group of light detectors has substantially the same dimensions as one transmissive section plus one non-transmissive section.

30. An optical encoder as in claim 29 wherein the individual light detectors each have substantially the same shape and size.

31. An optical encoder as in claim 30 wherein each of the transmission sections have substantially the same shape and size.

32. An optical encoder as in claim 31 wherein individual light detectors located a distance of one transmissive section plus one non-transmissive section apart have their outputs connected together forming coupled outputs.

33. An optical encoder as in claim 32 further comprising an electrical means for converting the coupled outputs into n/2 output channels where n equals the number of light detectors in one group.

34. An optical encoder as in claim 33 wherein each group of light detectors consists of four individual light detectors.

35. An optical encoder as in claim 34 wherein the outputs of the individual light detectors have substantially identical shapes and are delayed from each other by approximately integer multiples of 90°.

36. An optical encoder as in claim 35 wherein the emitter means comprises an LED and a collimating lens.

37. An optical encoder as in claim 36 wherein:
the individual light detectors are located in an array having two ends; and
a dummy light detector is located at each end of the array.

38. An optical encoder as in claim 37 wherein the light detectors are photodiodes.

39. An optical encoder as in claim 38 further comprising:
a second track on the light modulation means with transmissive and non-transmissive sections aligned to modulate a light beam; and
a second detector means, positioned in the light path, for receiving the light beam modulated by the second track, and for generating index signals that reach their extreme amplitude at least once during each excursion across the route.

40. An optical encoder as in claim 31 wherein:
the second detector means comprises individual light detectors located immediately adjacent to one another wherein the individual light detectors have outputs; and
the outputs of alternate light detectors are connected together thereby forming two output index signals.

41. An optical encoder as in claim 40 wherein the size and shape of the light detectors and transmissive sections are operative for the two output signals reaching their extreme amplitude at least once during each excursion across the route.

42. An optical encoder as in claim 41 further comprising an electical means coupled to the output index signals for producing an index pulse in response to the extreme amplitudes of the output index signals.

43. An optical encoder for indicating an object's movement along a route, comprising:
an emitter means for emitting a light beam along a light path;
a light modulation means located next to the emitter means and in the light path for modulating the light beam in response to the object's movement along a route; and
a detector means, positioned in the light path, for receiving the modulated light beam with detectors located immediately adjacent to one another and for generating index signals that reach their extreme amplitude at least once during each excursion across the route.

44. An optical encoder as in claim 43 wherein:
the outputs of alternate light detectors are connected together thereby forming two output index signals.

45. An optical encoder as in claim 44 wherein the light modulation means comprises an optical track positioned to cross the light path, the optical track having alternating transmissive and non-transmissive sections operative for modulating the light beam in response to movement along a route.

46. An optical encoder as in claim 45 wherein the size and shape of the light detectors and transmissive sections are operative for the two output signals reaching their extreme amplitude at least once during each revolution of the shaft.

47. An optical encoder as in claim 46 further comprising an electical means coupled to the output index signals for producing an index pulse in response to the extreme amplitudes of the output index signals.

* * * * *

UNITED STATES PATENT AND TRADEMARK OFFICE
CERTIFICATE OF CORRECTION

PATENT NO. : 4,691,101

DATED : September 1, 1987

INVENTOR(S) : Mark G. Leonard

It is certified that error appears in the above-identified patent and that said Letters Patent is hereby corrected as shown below:

Claim Number 40, Column 10, Line 11, "31" should read --39--.

Signed and Sealed this

Second Day of February, 1988

Attest:

DONALD J. QUIGG

*Attesting Officer*    *Commissioner of Patents and Trademarks*